United States Patent
Elkins et al.

(10) Patent No.: US 7,550,380 B2
(45) Date of Patent: Jun. 23, 2009

(54) ELECTROLESS PLATING OF METAL CAPS FOR CHALCOGENIDE-BASED MEMORY DEVICES

(75) Inventors: Patricia C. Elkins, Boise, ID (US); John T. Moore, Boise, ID (US); Rita J. Klein, Boise, ID (US)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 11/668,107

(22) Filed: Jan. 29, 2007

(65) Prior Publication Data

US 2007/0123039 A1     May 31, 2007

Related U.S. Application Data

(63) Continuation of application No. 10/980,658, filed on Nov. 3, 2004, now Pat. No. 7,189,626.

(51) Int. Cl.
    *H01L 21/44* (2006.01)
(52) U.S. Cl. .................. 438/652; 438/697; 438/399; 257/4; 257/E21.008; 257/E47.001; 257/E21.304
(58) Field of Classification Search .............. 438/652, 438/399, 382, 697, 385; 257/4, 5, E21.008, 257/E21.175, E21.01, E21.304, E47.001, 257/E29.08
See application file for complete search history.

(56) References Cited

U.S. PATENT DOCUMENTS

| | | | |
|---|---|---|---|
| 5,443,865 A | 8/1995 | Tisdale et al. | |
| 5,702,981 A | 12/1997 | Maniar et al. | |
| 5,827,777 A | 10/1998 | Schinella et al. | |
| 6,117,720 A | 9/2000 | Harshfield | |
| 6,236,059 B1 * | 5/2001 | Wolstenholme et al. | 257/3 |
| 6,277,729 B1 | 8/2001 | Wu | |
| 6,348,365 B1 | 2/2002 | Moore et al. | |
| 6,369,429 B1 | 4/2002 | Parmanick et al. | |
| 6,383,821 B1 | 5/2002 | Young et al. | |
| 6,451,698 B1 | 9/2002 | Au et al. | |
| 6,455,424 B1 | 9/2002 | McTeer et al. | |
| 6,468,858 B1 | 10/2002 | Lou | |

(Continued)

FOREIGN PATENT DOCUMENTS

EP     0257948 A2     3/1988

(Continued)

*Primary Examiner*—Caridad M Everhart
(74) *Attorney, Agent, or Firm*—Dinsmore & Shohl LLP

(57) ABSTRACT

A method of forming a metal cap over a conductive interconnect in a chalcogenide-based memory device is provided and includes, forming a layer of a first conductive material over a substrate, depositing an insulating layer over the first conductive material and the substrate, forming an opening in the insulating layer to expose at least a portion of the first conductive material, depositing a second conductive material over the insulating layer and within the opening, removing portions of the second conductive material to form a conductive area within the opening, recessing the conductive area within the opening to a level below an upper surface of the insulating layer, forming a cap of a third conductive material over the recessed conductive area within the opening, depositing a stack of a chalcogenide based memory cell material over the cap, and depositing a conductive material over the chalcogenide stack.

20 Claims, 5 Drawing Sheets

U.S. PATENT DOCUMENTS

| | | |
|---|---|---|
| 6,479,902 B1 | 11/2002 | Lopatin et al. |
| 6,501,111 B1 | 12/2002 | Lowrey |
| 6,531,373 B2 | 3/2003 | Gill et al. |
| 6,713,378 B2 | 3/2004 | Drynan |
| 6,731,528 B2 | 5/2004 | Hush et al. |
| 6,737,312 B2 | 5/2004 | Moore |
| 6,764,894 B2 | 7/2004 | Lowrey |
| 6,884,724 B2 | 4/2005 | Hsu et al. |
| 7,247,876 B2 * | 7/2007 | Lowrey ................ 257/19 |
| 2002/0096775 A1 * | 7/2002 | Ning ................ 257/763 |
| 2002/0168852 A1 | 11/2002 | Harshfield et al. |
| 2003/0035977 A1 | 2/2003 | Datta |
| 2003/0119317 A1 | 6/2003 | Nagami et al. |
| 2003/0203512 A1 | 10/2003 | Kweon |
| 2003/0227091 A1 | 12/2003 | Sinha et al. |
| 2003/0228749 A1 | 12/2003 | Sinha et al. |
| 2005/0006681 A1 * | 1/2005 | Okuno ................ 257/295 |
| 2005/0082678 A1 * | 4/2005 | Barth ................ 257/774 |
| 2005/0122771 A1 | 6/2005 | Chen |
| 2005/0124155 A1 | 6/2005 | Brooks et al. |

FOREIGN PATENT DOCUMENTS

WO    WO 2004055825 A1    7/2004

* cited by examiner

ELECTROLESS PLATING OF METAL CAPS FOR CHALCOGENIDE-BASED MEMORY DEVICES

CROSS-REFERENCE TO RELATED APPLICATIONS

This application is a continuation of U.S. patent application Ser. No. 10/980,658, filed Nov. 3, 2004, now U.S. Pat. No. 7,189,626, issued Mar. 13, 2007.

BACKGROUND OF THE INVENTION

The present invention relates to the field of electrochemical deposition, and more particularly to a method of electroless plating a metal cap over a conductive interconnect and to chalcogenide-based memory devices that include such structure.

The performance characteristics and reliability of integrated circuits have become increasingly dependent on the structure and attributes of the vias and interconnects which are used to carry electronic signals between semiconductor devices on integrated circuits or chips. Advances in the fabrication of integrated circuits have resulted in increases in the density, number of semiconductor devices contained on a typical chip, and speed. Interconnect structure and formation technology has not advanced as rapidly, and is increasingly becoming a limitation on the signal speed of integrated circuits.

Present-day, high-performance integrated circuits typically have multiple layers of metal conducting lines. These metal layers are separated by relatively thick, insulating layers of materials such as silicon dioxide. Vias are made through the insulating layers to make connections between the metal lines. It is often desirable that the metal conducting lines be maintained in as much of a plane as possible to avoid undue stresses on the metal lines. A tungsten metal plug is often used to fill the via in the insulating layer covering a first metal pad or line so that the overlying film remains on the planar surface of the insulating layer. Without the plug, the overlying film must dip into the via to make contact with the underlying first metal.

A layer of titanium (Ti) is typically placed in contact with the underlying first metal as an adhesion layer for the subsequent tungsten contacts. The via is then filled by depositing tungsten metal, typically by a chemical vapor deposition (CVD) process. When high aspect ratio vias are to be filled, tungsten deposited on the sidewalls of the via during the deposition process may pinch off the opening, leaving a void termed a "keyhole" buried within the via. When excess tungsten from the CVD deposition process is removed, typically using a chemical-mechanical planarizing (CMP) process, the buried "keyholes" may be opened up, leaving exposed voids at the tops of the vias. Such voids adversely affect the subsequent formation of other layers and the electrical connections between layers.

Accordingly, the need still exists in the art for a process of providing metal-filled high aspect ratio vias that result in good electrical connections to subsequent layers of a fabrication process for semiconductor devices.

SUMMARY OF THE INVENTION

The present invention meets that need and provides a method of forming a metal cap over a conductive plug, via, or interconnect to cover or fill the keyhole in the plug, via, or interconnect and provide good electrical contact for subsequent layers in the semiconductor device. The metal cap is preferably formed of cobalt, silver, copper, gold, nickel, palladium, platinum, or alloys thereof. The metal cap is preferably formed by the electroless deposition of the metal over, for example, a tungsten plug or interconnect. Chalcogenide-based memory devices that employ the metal cap construction are also disclosed.

More particularly, in accordance with one aspect of the invention, a method of forming a metal cap over a conductive interconnect in a chalcogenide-based memory device is provided and includes forming a layer of a first conductive material over a substrate and depositing an insulating layer over the first conductive material and the substrate. An opening is formed in the insulating layer to expose at least a portion of the first conductive material, and a second conductive material is deposited over the insulating layer and within the opening. Portions of the second conductive material are removed to form a conductive area within the opening, and the conductive area is recessed within the opening to a level below an upper surface of the insulating layer. A cap of a third conductive material is formed over the recessed conductive area within the opening. A chalcogenide material is deposited over the cap, and a conductive material is deposited over the chalcogenide material to form the memory device.

The third conductive material is selected from the group consisting of cobalt, silver, gold, copper, nickel, palladium, platinum, and alloys thereof. The cap of the third conductive material is preferably formed by electroless plating. Where an electroless plating process is used, the surface of the recessed conductive area may optionally be activated prior to electroless deposition of the third conductive material.

In another embodiment of the invention, a method of forming a metal cap over a conductive interconnect in a chalcogenide-based memory device is provided and includes providing an insulating layer over a substrate, the insulating layer having an opening therein and the opening exposing at least a portion of a first conductive material on the substrate. A second conductive material is deposited over the insulating layer and within the opening. Portions of the second conductive material are removed to form a conductive area within the opening, and the conductive area within the opening is recessed to a level below an upper surface of the insulating layer. A cap of a third conductive material is formed over the recessed conductive area within the opening. Preferably, the third conductive material is selected from the group consisting of cobalt, silver, gold, copper, nickel, palladium, platinum, and alloys thereof. A stack of chalcogenide based memory cell material is deposited over the cap, and a conductive material is deposited over the chalcogenide stack.

In another embodiment of the invention, a method of forming a metal cap over a conductive interconnect in a chalcogenide-based memory device is provided and includes providing an insulating layer over a substrate, the insulating layer having an opening therein and the opening exposing at least a portion of a first conductive material on the substrate. A second conductive material is deposited over the insulating layer and within the opening. Portions of the second conductive material are removed to form a conductive area within the opening, and the conductive area within the opening is recessed to a level below an upper surface of said insulating layer. A cap of cobalt metal is formed over the recessed conductive area. A stack of chalcogenide based memory cell material is deposited over the cap, and a conductive material is deposited over the chalcogenide stack.

In yet another embodiment of the invention, a method of forming a metal cap over a tungsten interconnect in a chalcogenide-based memory device is provided and includes forming a tungsten interconnect recessed within an opening in an insulating layer, and forming a metal cap over the recessed tungsten layer by electroless deposition of a metal. The metal is preferably selected from the group consisting of cobalt, silver, gold, copper, nickel, palladium, platinum, and alloys thereof.

In yet another embodiment of the invention, a method of forming a conductive metal interconnect for a semiconductor circuit is provided and includes providing a semiconductor structure having semiconductor devices formed thereon, forming an insulating layer over the semiconductor structure, and forming a trench in the insulating layer down to the semiconductor structure. The trench is substantially filled with tungsten, and the tungsten is recessed to a level below the upper surface of the insulating layer. A metal cap is electrolessly deposited over the recessed tungsten. Preferably, the metal cap comprises a metal selected from the group consisting of cobalt, silver, gold, copper, nickel, palladium, platinum, and alloys thereof.

In yet another embodiment of the invention, a conductive interconnect for a chalcogenide-based memory device is provided and includes an insulating layer having an opening therein on a semiconductor substrate, a recessed tungsten layer in the opening, and an electrolessly deposited metal cap on the tungsten layer. The metal cap preferably comprises a metal selected from the group consisting of cobalt, silver, gold, copper, nickel, palladium, platinum, and alloys thereof. A stack of chalcogenide based memory cell material is over the cap, and a conductive material is over the chalcogenide stack.

In yet another embodiment of the invention, a processor-based system is provided and includes a processor and a chalcogenide-based memory device coupled to the processor. The chalcogenide-based memory device comprises an insulating layer having an opening therein on a semiconductor substrate, a recessed tungsten layer in the opening, and an electrolessly deposited metal cap on the tungsten layer. The metal cap preferably comprises a metal selected from the group consisting of cobalt, silver, gold, copper, nickel, palladium, platinum, and alloys thereof. A stack of chalcogenide based memory cell material is over the cap, and a conductive material is over the chalcogenide stack.

Accordingly, it is a feature of the present invention to provide a method of forming a metal cap over a conductive plug, via, or interconnect to both protect the conductive plug, via, or interconnect and provide good electrical contact for subsequent layers in the semiconductor device. It is also a feature of the present invention to provide chalcogenide-based memory devices that employ the metal cap construction. These and other features and advantages of the invention will be more apparent from the following detailed description, which is provided in connection with the accompanying drawings, which illustrate exemplary embodiments of the invention.

DETAILED DESCRIPTION OF THE PREFERRED EMBODIMENTS

Figure 1:
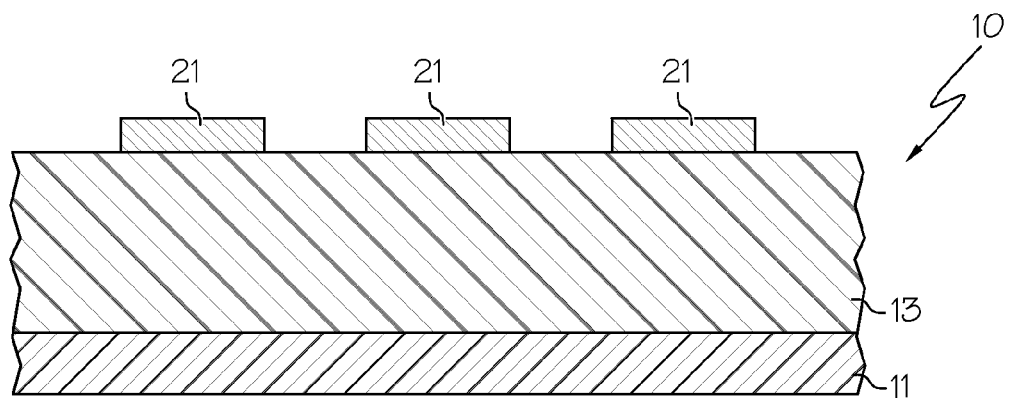
FIG. 1 is a cross-sectional view of an example of a portion of a partially fabricated chalcogenide-based memory device including metal 1 layers on a substrate surface in accordance with an embodiment of the invention.

It is observed that the process steps and structures described herein do not form a complete process flow for manufacturing integrated circuits. Embodiments of the present invention can be practiced in conjunction with a variety of integrated circuit fabrication techniques currently used in the art. As such, commonly practiced process steps are included in the description herein only if those steps are necessary for an understanding of the invention.

The term "substrate" as used herein may include any semiconductor-based structure that has an exposed semiconductor surface. The term includes structures such as, for example, silicon, silicon-on insulator (SOI), silicon-on sapphire (SOS), doped and undoped semiconductors, epitaxial layers of silicon supported by a base semiconductor foundation, and other semiconductor structures. The semiconductor need not be silicon-based. The semiconductor may be silicon-germanium, or germanium. When reference is made to a "substrate" herein, previous process steps may have been utilized to form regions or junctions in or on the base semiconductor or foundation. As used herein, the term "over" means formed above a surface of an underlying layer or substrate.

Referring now to the drawings, where like elements are designated by like reference numerals, FIGS. 1 through 9 illustrate an exemplary embodiment of a method of fabricating a chalcogenide-based memory device having at least one interconnect that includes a metal cap. The process begins subsequent to the formation of the integrated circuit structure 10. However, the process may be applied at any level of integrated circuit fabrication. For purposes of simplification, this embodiment of the invention is described with reference to an upper metalization layer.

FIGS. 1 through 9 illustrate a partially-fabricated integrated circuit structure 10 having a base substrate 11 and a plurality of fabricated layers collectively shown by 13. A series of conductive areas 21 which are electrically connected to one or more layers or devices in the circuit below are formed on the circuit structure by conventional techniques. Although not shown, it is to be understood that the integrated circuit structure 10 may contain transistors, capacitors, word lines, bit lines, active areas, or the like fabricated in layer 13 over substrate 11.

Figure 2:
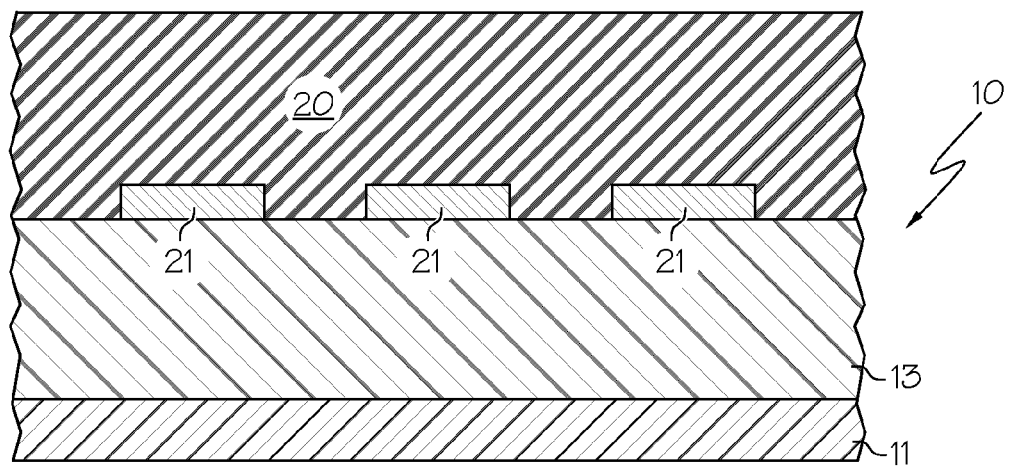
FIG. 2 is a cross-sectional view of a portion of a partially fabricated chalcogenide-based memory device including an insulating layer over the surface of the substrate.
Figure 3:
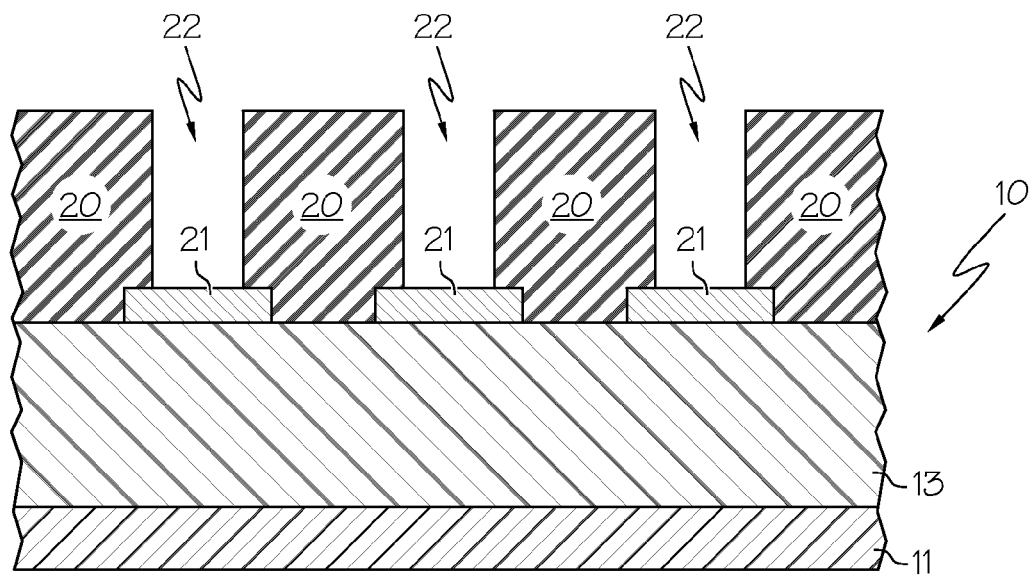
FIG. 3 is a cross-sectional view of a portion of a partially fabricated chalcogenide-based memory device including openings formed in the insulating layer.

As shown in FIG. 2, an insulating layer 20 is provided over structure 10. Insulating layer 20 preferably comprises tetraethylorthosilicate (TEOS) or other dielectric material such as, for example, borophosphosilicate glass (BPSG), borosilicate glass (BSG), or other non-conductive oxides (doped or undoped), nitrides, and oxynitrides. Insulating layer 20, which may itself be formed of multiple layers, is preferably from about 5,000 to about 20,000 Angstroms in thickness. As shown in FIG. 3, at least some of the openings 22 are provided at locations where interconnects will electrically communicate with conductive areas 21 provided in the uppermost portion of structure 10.

Figure 4:
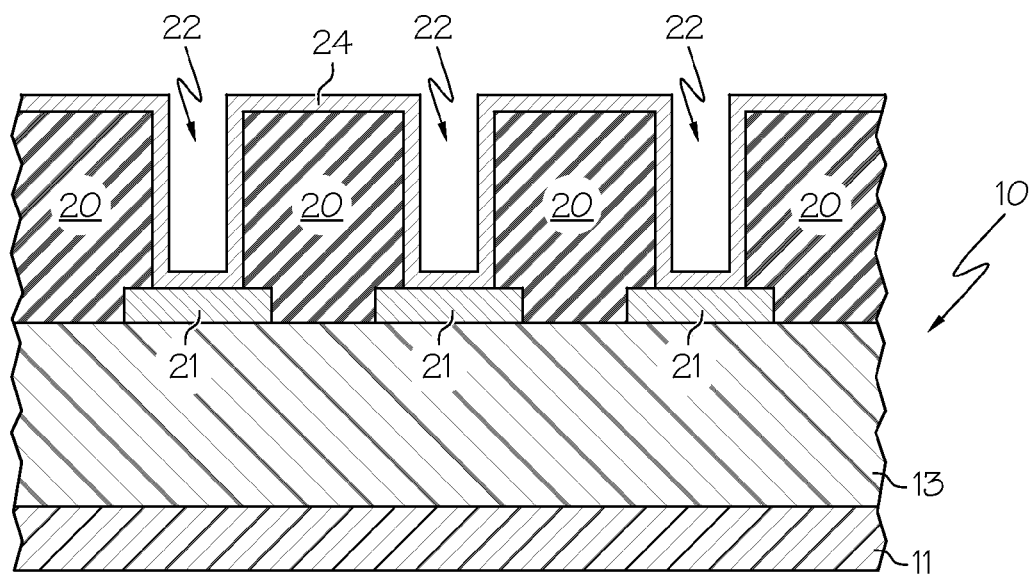
FIG. 4 is a cross-sectional view of a portion of a partially fabricated chalcogenide-based memory device that includes an optional conformal adhesion layer.

Referring again to FIG. 3, a plurality of openings such as interconnect trenches 22 are patterned and etched in insulating layer 20. Openings 22 are aligned to expose portions of conductive areas 21. As shown in FIG. 4, an optional adhesion layer 24 is deposited over the surface of structure 10 so that it conformally covers insulating layer 20 and lines interconnect trenches 22. Optional adhesion layer 24 may be used, as is conventional in the art, to improve the bond between conductive areas 21 and subsequently deposited conductive materials. Depending on the materials used in the fabrication of the device, there will be instances where no adhesion layer 24 is necessary.

Optional adhesion layer 24 is preferably formed of a refractory metal such as titanium (Ti). As shown in FIG. 4, in one embodiment, an optional thin Ti film 24 may be deposited using physical vapor deposition (PVD), chemical vapor deposition (CVD), or atomic layer deposition (ALD). However, any suitable material may be used for the adhesion layer, for example, tungsten-nitride, tungsten-tantalum, tantalum silicon nitride, or other ternary compounds. Optional adhesion layer 24 is preferably between about 100 Angstroms to about 500 Angstroms thick, and more preferably about 200 Angstroms thick.

Figure 5:
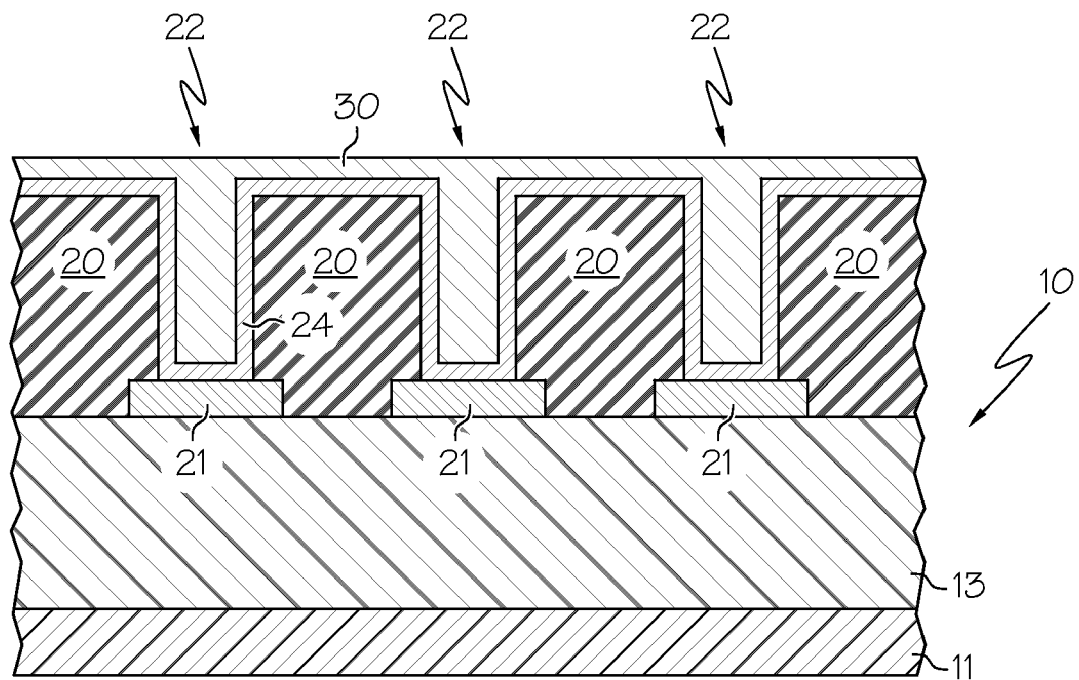
FIG. 5 is a cross-sectional view of a portion of a partially fabricated chalcogenide-based memory device that includes a conductive material filling the openings in the insulating layer.
Figure 6:
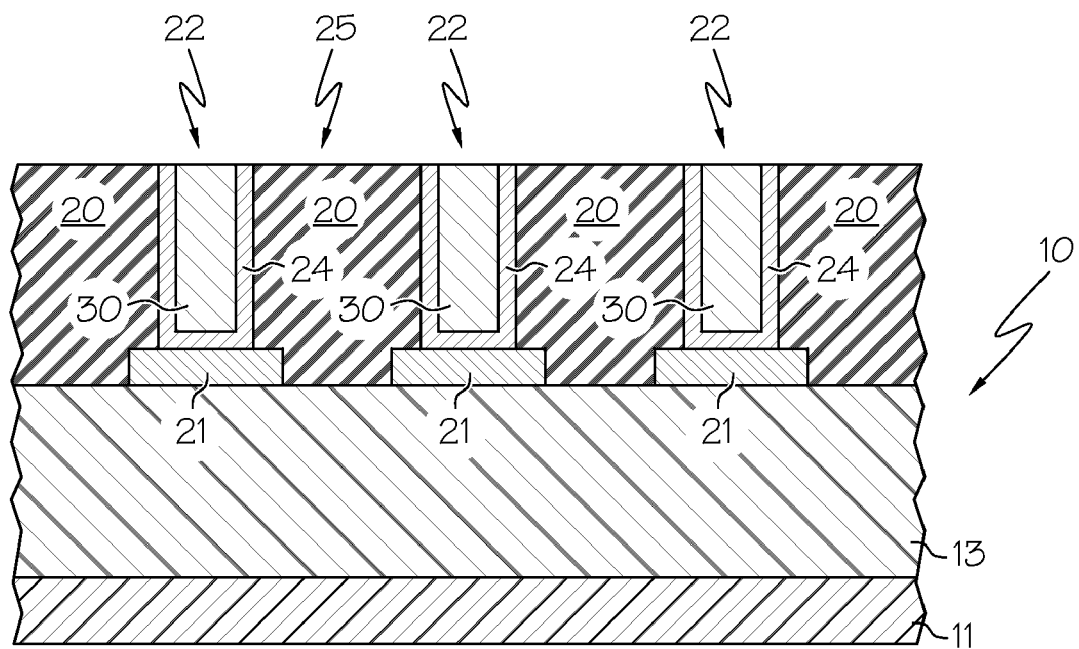
FIG. 6 is a cross-sectional view of a portion of a partially fabricated chalcogenide-based memory device in which excess conductive material has been removed.

Referring now to FIG. 5, a conductive interconnect material, preferably comprising tungsten, is formed over the structure 10 and in the interconnect trenches 22. The conductive interconnects 30 may be formed using any technique that is conventional in this art including, for example, CVD or ALD techniques. Both techniques result in a conformal fill of trenches 22. However, depending on the aspect ratio and width of the trenches, such conformal deposition techniques may result in keyhole formation within the tungsten plug. Typically, the interconnects 30 will have a thickness of from about 1,000 to about 5,000 Angstroms, and preferably about 2,000 Angstroms. Referring now to FIG. 6, excess material from conductive interconnects 30 is removed. Typically, such material is removed using chemical-mechanical planarization (CMP) techniques that are well known in the art. Desirably, the removal of excess material is stopped substantially level with an upper surface 25 of insulating layer 20.

Figure 7:
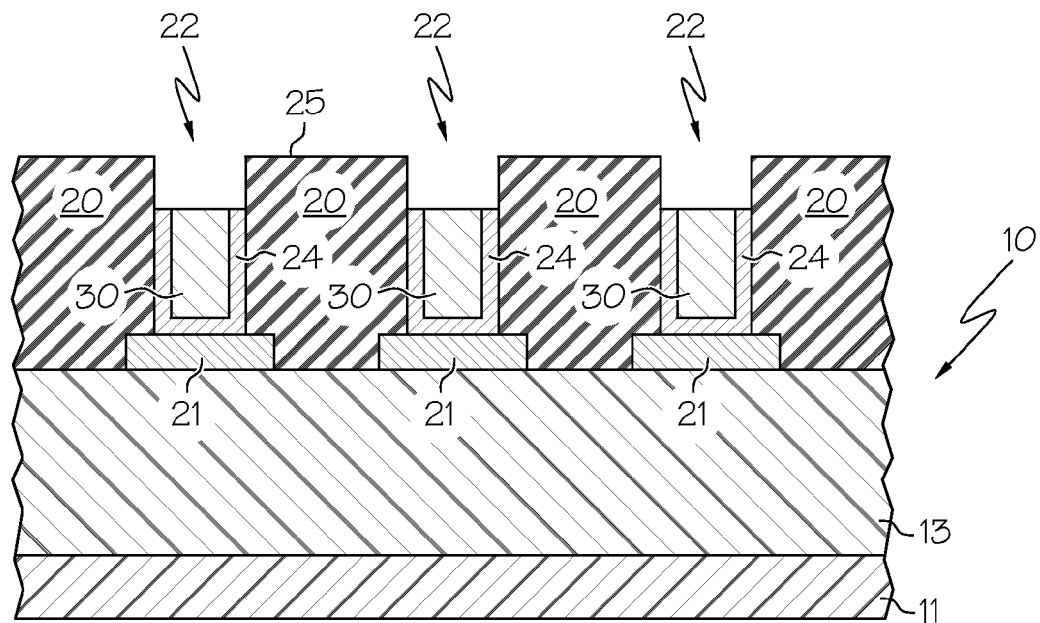
FIG. 7 is a cross-sectional view of a portion of a partially fabricated chalcogenide-based memory device in which the surface of the conductive material has been recessed below the upper surface of the insulating layer.

Referring now to FIG. 7, conductive interconnect 30 is further planarized or over-polished to create a dish or recess for a suitable distance below the upper surface 25 of insulating layer 20. Any suitable method for recessing the interconnect material may be used. For example, conductive interconnect 30 may be selectively over-polished, chemical mechanically planarized, wet etched, or dry etched to recess the interconnect material within the trenches 22 and below the surface of insulating layer 20. Typically, a recess of from about 200 to about 500 Angstroms is preferred.

In one embodiment, the recessed surface of interconnect material 30 may be optionally activated to render that surface selective to the metal plating to follow. However, in some embodiments, those persons skilled in this art will recognize that surface activation is not necessary. Surface activation may be accomplished using a number of techniques. Preferably, the surface is activated by exposure to any activation solution known in the art of electroless plating such as, for example, a palladium chloride solution. A typical time frame for surface exposure may be for from about 10 seconds to about two minutes depending upon the particular activation solution that is selected.

Figure 8:
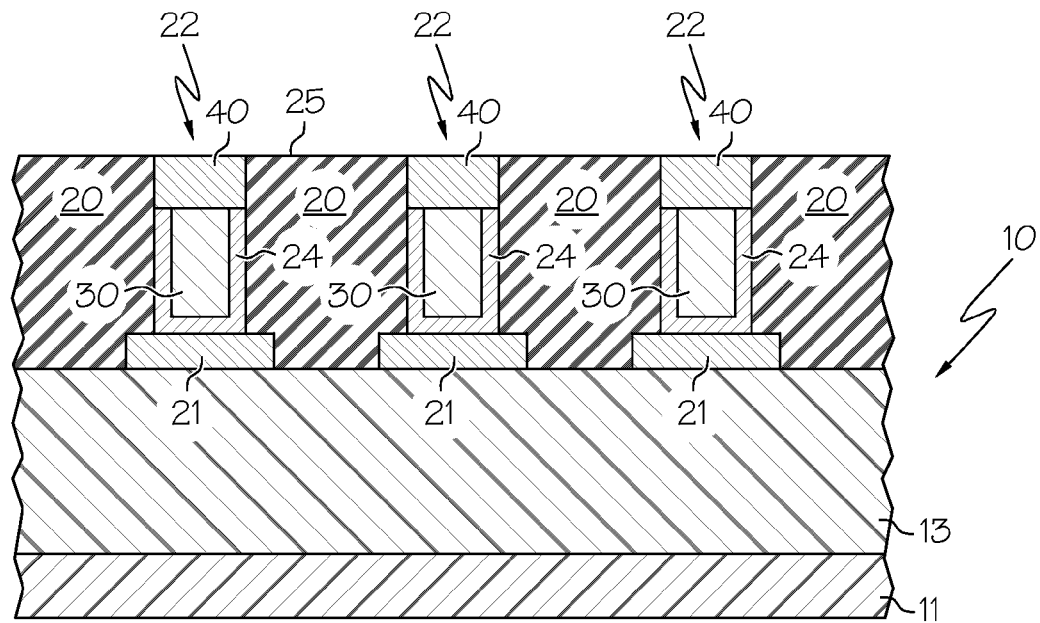
FIG. 8 is a cross-sectional view of a portion of a partially fabricated chalcogenide-based memory device that includes a cap of a conductive material on the conductive material filling the opening.

Referring now to FIG. 8, metal is then selectively deposited into the recesses using an electroless plating process. The metal layers formed in the recesses may comprise any suitable metal which is compatible with adjacent materials in the semiconductor structure. Preferably the metal layers comprise cobalt, silver, gold, copper, nickel, palladium, platinum, or alloys thereof. Most preferably, the metal comprises cobalt because cobalt is readily available and provides a fine grain structure which promotes a smoother surface for subsequent processing.

Preferably, metal caps having a thickness of from about 200 to about 500 Angstroms are formed. By controlling the rate of plating of the caps, one can produce caps that are substantially co-planar with the upper surface of insulating layer 20. Where excess metal is plated over the substrate, the excess may be removed by conventional processing methods such as planarization of the structure shown in FIG. 8 to isolate the metal layer into individual metal caps 40 as shown. The FIG. 8 structure may then be further processed to create a functional circuit.

Figure 9:
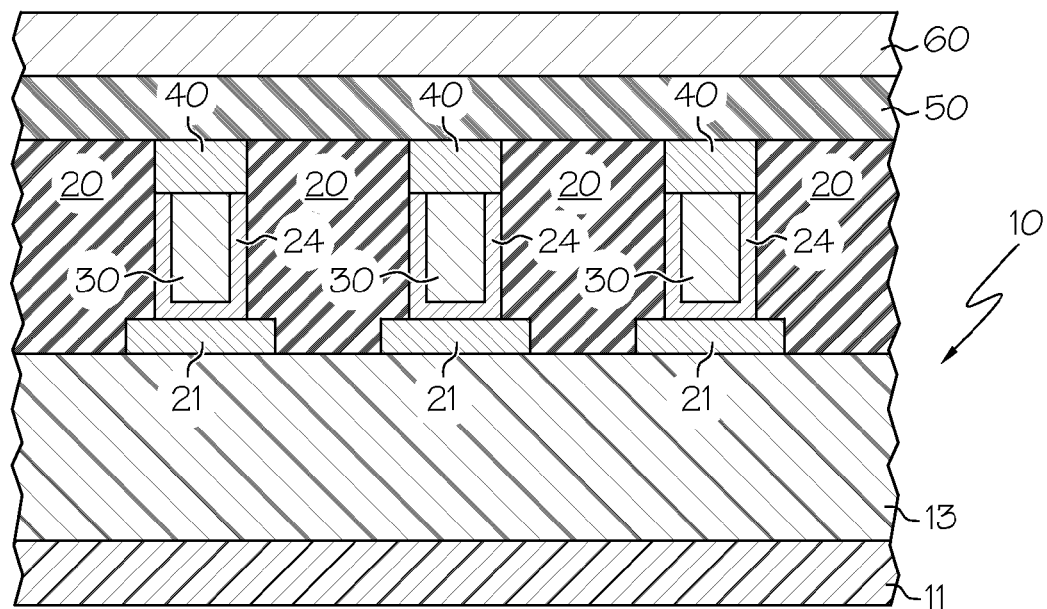
FIG. 9 is a cross-sectional view of a portion of a partially fabricated chalcogenide-based memory device in which a stack of chalcogenide based memory cell material is positioned over the cap, and a layer of another conductive material is positioned over the chalcogenide based memory cell stack.

As shown in FIG. 9, a memory device is formed by depositing a stack of suitable chalcogenide materials 50 over insulating layer 20 and metal caps 40. The chalcogenide material may be formed from a chalcogenized glass such as $Ge_3Se_7$ $Ge_4Se_6$ which are capable of forming conductive paths for diffused metal ions such as silver in the glass in the presence of an applied voltage. A second conductive electrode 60 is deposited over chalcogenide stack 50 to complete the formation of the memory device. An example of a nonvolatile memory device is shown in Moore and Gilton, U.S. Pat. No. 6,348,365. By "stack," we mean one or more layers of chalcogenide glass material, including diffused metal ions, sufficient to form a memory cell.

Figure 10:
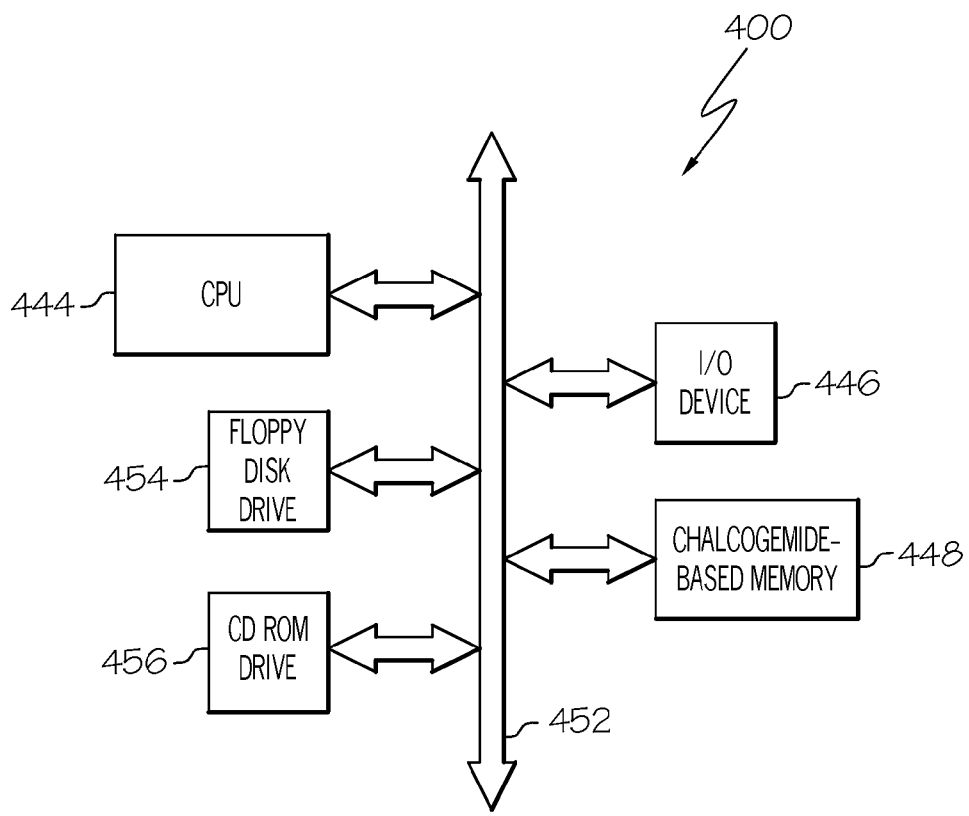
FIG. 10 illustrates a processor system having one or more chalcogenide-based memory devices according to additional embodiments of the present invention.

Referring now to FIG. 10, a typical chalcogenide-based memory system 400 is shown which includes an integrated circuit 448. Integrated circuit 448 employs a conductive interconnect and chalcogenide-based memory fabricated in accordance with one or more embodiments of the invention. A processor system, such as a computer system, generally comprises a central processing unit (CPU) 444, such as a microprocessor, a digital signal processor, or other programmable digital logic devices, which communicates with an input/output (I/O) device 446 over a bus 452. The chalcogenide-based memory in integrated circuit 448 communicates with the system over bus 452 typically through a memory controller.

In the case of a computer system, the system may include peripheral devices such as a floppy disk drive 454 and a compact disc (CD) ROM drive 456, which also communicate with CPU 444 over the bus 452. Integrated circuit 448 may include one or more conductive interconnects and chalcogenide-based memory devices. If desired, the integrated circuit 448 may be combined with the processor, for example CPU 444, in a single integrated circuit. Other examples of devices and systems which may include chalcogenide-based memory devices include clocks, televisions, cellular telephones, automobiles, aircraft, and the like.

It will be apparent to those skilled in the art that various changes may be made without departing from the scope of the invention which is not considered limited to the specific embodiments described in the specification and drawings, but is only limited by the scope of the appended claims.

What is claimed is:

1. A method of forming a metal cap over a conductive interconnect in a chalcogenide-based memory device comprising, forming a layer of a first conductive material over a substrate, depositing an insulating layer over said first conductive material and said substrate, forming an opening in said insulating layer to expose at least a portion of said first conductive material, depositing a second conductive material over said insulating layer and within said opening, removing portions of said second conductive material to form a conductive area within said opening, recessing said conductive area within said opening to a level below an upper surface of said insulating layer, forming a cap of a third conductive material over the recessed conductive area within said opening by electroless plating, depositing a stack of a chalcogenide based memory cell material over said cap, and depositing a conductive material over said chalcogenide stack.

2. A method as claimed in claim 1 including activating the surface of the recessed conductive area.

3. A method as claimed in claim 1 in which said second conductive material comprises tungsten.

4. A method as claimed in claim 1 including removing portions of said cap to planarize said cap.

5. A method as claimed in claim 1 in which said cap is formed to have a thickness of from about 200 to about 500 angstroms.

6. A method as claimed in claim 1 in which said insulating layer is selected from the group consisting of borophosphosilicate glass, tetraethylorthosilicate glass, and silicon nitride.

7. A method as claimed in claim 1 wherein said cap is formed to be substantially co-planar with said upper surface of said insulating layer.

8. A method as claimed in claim 1 including the step of depositing a refractory metal or refractory metal nitride layer in said opening prior to the deposition of said second conductive material.

9. A method as claimed in claim 8 in which said refractory metal comprises titanium.

10. A method as claimed in claim 8 in which said refractory metal nitride comprises titanium nitride.

11. A method of forming a metal cap over a conductive interconnect in a chalcogenide-based memory device comprising, providing an insulating layer over a substrate, said insulating layer having an opening therein, said opening exposing at least a portion of a first conductive material on said substrate, depositing a second conductive material over said insulating layer and within said opening, removing portions of said second conductive material to form a conductive area within said opening, recessing said conductive area within said opening to a level below an upper surface of said insulating layer, forming a cap of a third conductive material comprising a metal over the recessed conductive area within said opening by electroless plating, depositing a stack of a chalcogenide based memory cell material over said cap, and depositing a conductive material over said chalcogenide stack.

12. A method as claimed in claim 11 wherein said cap is formed to be substantially co-planar with said upper surface of said insulating layer.

13. A method of forming a conductive metal interconnect for a semiconductor circuit comprising, providing a semiconductor structure having semiconductor devices formed thereon, forming an insulating layer over said semiconductor structure, forming a trench in said insulating layer down to said semiconductor structure exposing at least a portion of said semiconductor devices, substantially filling said trench with tungsten, recessing said tungsten to a level below the upper surface of said insulating layer, electrolessly depositing a metal cap over the recessed tungsten, depositing a stack of a chalcogenide based memory cell material over said cap, and depositing a conductive material over said chalcogenide stack.

14. A method as claimed in claim 13 including activating the surface of the recessed tungsten prior to electrolessly depositing said metal cap.

15. A method as claimed in claim 13 including removing portions of said cap such that said cap is substantially co-planar with said upper surface of said insulating layer.

16. A method as claimed in claim 13 wherein said cap is formed to be substantially co-planar with said upper surface of said insulating layer.

17. A conductive interconnect for a chalcogenide-based memory device comprising, an insulating layer having an opening therein on a semiconductor substrate, a recessed tungsten layer in said opening, an electrolessly deposited metal cap on said tungsten layer, a stack of a chalcogenide based memory cell material over said cap, and a conductive material over said chalcogenide stack.

18. A conductive interconnect as claimed in claim 17 in which said metal cap is substantially coplanar with an upper surface of said insulating layer.

19. A processor-based system comprising a processor, and a chalcogenide-based memory device coupled to said processor, said chalcogenide-based memory device comprising an insulating layer having an opening therein on a semiconductor substrate, a recessed tungsten layer in said opening, an electrolessly deposited metal cap on said tungsten layer, a stack of a chalcogenide based memory cell material over said cap, and a conductive material over said chalcogenide stack.

20. A system as claimed in claim 19 in which said metal cap is substantially coplanar with an upper surface of said insulating layer.

* * * * *